(12) United States Patent
Kanamitsu et al.

(10) Patent No.: US 9,263,304 B2
(45) Date of Patent: Feb. 16, 2016

(54) MANUFACTURING METHOD OF SEMICONDUCTOR DEVICE

(75) Inventors: Kenji Kanamitsu, Kanagawa (JP); Takuya Koga, Kanagawa (JP); Kazutoshi Anabuki, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 1069 days.

(21) Appl. No.: 13/186,458

(22) Filed: Jul. 19, 2011

(65) Prior Publication Data
US 2012/0017948 A1    Jan. 26, 2012

(30) Foreign Application Priority Data
Jul. 20, 2010  (JP) ................. 2010-162826

(51) Int. Cl.
H01L 21/30   (2006.01)
H01L 21/67   (2006.01)
H01L 21/02   (2006.01)
H01L 21/311  (2006.01)

(52) U.S. Cl.
CPC .... *H01L 21/67051* (2013.01); *H01L 21/02057* (2013.01); *H01L 21/31133* (2013.01)

(58) Field of Classification Search
CPC ............. H01L 21/67051; H01L 21/02057
USPC ........................................................ 134/33
See application file for complete search history.

(56) References Cited

FOREIGN PATENT DOCUMENTS

| JP | 07-221062 A | | 8/1995 |
|----|---|---|---|
| JP | 07221062 A | * | 8/1995 |
| JP | 9-92635 A | | 4/1997 |
| JP | 11-233473 A | | 8/1999 |
| JP | 2007-221026 A | | 8/2007 |
| JP | 2007221026 A | * | 8/2007 |
| JP | 2008-159789 A | | 7/2008 |
| JP | 2008159789 A | * | 7/2008 |
| JP | 2010-087326 A | | 4/2010 |
| JP | 2010087326 A | * | 4/2010 |

OTHER PUBLICATIONS

Office Action dated Mar. 4, 2014, in Japanese Patent Application No. 2010-162826.

* cited by examiner

*Primary Examiner* — Michael Kornakov
*Assistant Examiner* — Katelyn Whatley
(74) *Attorney, Agent, or Firm* — Shapiro, Gabor and Rosenberger, PLLC

(57) ABSTRACT

Suppressed is damage of a semiconductor wafer due to charging of a cleaning liquid used in a single wafer type wafer cleaning step.
A chemical solution discharged from a tip of a cleaning nozzle is brought into contact with protrusions of wafer chucks to thereby let static electricity of the chemical solution go to the wafer chucks, and subsequently, the cleaning nozzle is moved above the wafer to supply the chemical solution onto a top surface of the wafer, thereby suppressing abnormal discharge (damage) of the wafer due to charging of the chemical solution.

9 Claims, 13 Drawing Sheets

MANUFACTURING METHOD OF SEMICONDUCTOR DEVICE

CROSS-REFERENCE TO RELATED APPLICATION

The disclosure of Japanese Patent Application No. 2010-162826 filed on Jul. 20, 2010 including the specification, drawings and abstract is incorporated herein by reference in its entirety.

BACKGROUND

The present invention relates to a manufacturing method of a semiconductor device and, in particular, to technology effective in applying to a cleaning method for removing contaminants attached onto a surface of a semiconductor wafer.

Since various kinds of contaminants, such as particles (fine particles), organic substances, and metal, attach onto and remain on a surface of a semiconductor wafer (hereinafter simply referred to as a wafer) in manufacturing steps of a semiconductor device, cleaning processing is essential in which these contaminants are removed using a cleaning liquid (a chemical solution or pure water). However, in a step of processing the surface of the wafer with the cleaning liquid, there occur such problems that the wafer is charged due to various causes, and that thereby a semiconductor element formed on the wafer is damaged or destroyed by static electricity.

In Patent Document 1 (Japanese Patent Laid-Open No. 2007-221026), disclosed is wafer cleaning technology that prevents static electricity charged on a wafer from being transmitted through a cleaning liquid at the moment when the cleaning liquid is discharged and then being partially discharged. Specifically, when cleaning the wafer while scanning a nozzle for supplying the cleaning liquid, first, discharge of the cleaning liquid is started from an area other than an element formation region of the wafer (a peripheral portion of the wafer), and subsequently, the nozzle for supplying the cleaning liquid is moved to the element formation region to clean it. According to this method, since the cleaning liquid is discharged to the element formation region after discharged to the peripheral portion of the wafer to discharge the static electricity, a semiconductor element formed in the element formation region is not affected by the static electricity.

In Patent Document 2 (Japanese Patent Laid-Open No. 2008-159789), disclosed is a single wafer type cleaner in which chuck pins that hold a wafer are comprised of conductive resin of a lower resistance (not more than 100 k$\Omega$), and in which pipes that supply a cleaning liquid to a front surface and a back surface of the wafer are comprised of conductive resin of a lower resistance (not more than 100$\Omega$) for the purpose of discharging static electricity charged on the wafer and static electricity generated by a flow of the cleaning liquid.

In Patent Document 3 (Japanese Patent Laid-Open No. 1997-092635), disclosed is a cleaner in which a carrier that holds a wafer is comprised of a conductive material whose volume resistivity is not more than $1 \times 10^{15}$ $\Omega$/cm, and in which charging of the carrier is prevented by grounding it to eventually suppress charging of the wafer in contact with the carrier.

SUMMARY

In a wafer cleaning step after CMP (Chemical Mechanical Polishing) that is one of manufacturing steps of a semiconductor device, and a wafer cleaning step after a resist is removed, cleaning processing using an SPM and an APM is mainly performed. SPM cleaning is cleaning processing in which contaminants (particularly, organic contaminants) on a surface of a wafer are removed by cleaning the wafer at a temperature of approximately 120° C. using a chemical solution made by adding hydrogen peroxide solution to sulfuric acid. In addition, APM cleaning is cleaning processing using a chemical solution made by adding hydrogen peroxide solution to ammonia, and it is also called SC1 cleaning.

The inventor has discovered a phenomenon in which abnormal discharge is generated on a wafer and thereby the wafer is irreversibly damaged in a single wafer type SPM cleaning step performed after resist removal. Consequently, when investigating a chemical solution supply system of a single wafer type cleaner, it has turned out that a chemical solution (SPM) stored in a chemical solution tank is subjected to friction with inner walls of pipes to be charged on a way to be sent to a cleaning nozzle through the pipes, and that as a result of it, static electricity is discharged from the chemical solution to the wafer at the moment when the chemical solution discharged from the cleaning nozzle gets contact with a surface of the wafer.

In addition, it has also become apparent from an examination by the inventor that the above-described charging of the chemical solution is generally generated in a chemical solution containing electrolytes, such as acid and alkali and, in particular, it is easily generated in a chemical solution containing sulfuric acid, such as an SPM.

Further, it has also become apparent from an examination by the inventor that abnormal discharge of the wafer due to the above-described charging of the chemical solution is generated when a thin film, such as an insulating film or a semiconductor film, has been attached to the wafer more easily than when a substrate (single crystal silicon) is exposed on a back surface of the wafer. For example, in manufacturing steps of a CMOS (Complementary Metal Oxide Semiconductor) transistor, after thermally oxidizing a wafer to form a gate insulating film, a polycrystalline silicon film for gate electrodes is deposited over the gate insulating film using a CVD method. At this time, a back surface of the wafer is also oxidized to form a silicon oxide film (gate insulating film), and subsequently, a polycrystalline silicon film attaches to a surface of this silicon oxide film. As a result of it, capacitance comprised of a substrate (single crystal silicon)—the silicon oxide film—the polycrystalline silicon film is formed on the back surface of the wafer, and when wafer cleaning is performed with a charged chemical solution in such a state, abnormal discharge is easily generated.

Consequently, although the inventor tried to make the pipes of the chemical solution supply system comprised of a conductive material, or tried to ground the chemical solution flowing through the pipes with a conductive wire as prevention measures for the above-described charging of the chemical solution, these measures could not effectively prevent the charge of the chemical solution. In addition, although the inventor tried to make wafer chucks (parts for holding a periphery of a wafer) provided in the single wafer type cleaner comprised of the conductive material, and tried to discharge outside through the wafer chucks static electricity of the chemical solution discharged from the cleaning nozzle to the surface of the wafer, this method was not able to prevent abnormal discharge of the wafer due to the charged chemical solution.

The present invention has been made in view of the above circumstances and provides technology that can suppress damage of a wafer due to charging of a chemical solution used in a single wafer type wafer cleaning step.

The other purposes and the new feature of the present invention will become clear from the description of the present specification and the accompanying drawings.

The following explains briefly the outline of a typical invention among the inventions disclosed in the present application.

A manufacturing method of a semiconductor device that is one embodiment of the application includes a step of cleaning a semiconductor wafer by supplying a chemical solution onto a top surface of the semiconductor wafer from a cleaning nozzle while holding a periphery of the semiconductor wafer with wafer chucks and rotating the semiconductor wafer and the wafer chucks in a horizontal plane. Additionally, in the method, the chemical solution is brought into contact with the wafer chucks prior to a step of supplying the chemical solution onto the top surface of the semiconductor wafer.

The following explains briefly the effect acquired by the typical invention among the inventions disclosed in the present application.

Static electricity of the chemical solution can be discharged through the wafer chucks by bringing the chemical solution into contact with the wafer chucks prior to the step of supplying the chemical solution onto the top surface of the semiconductor wafer, thus enabling to suppress damage of the semiconductor wafer due to charging of the chemical solution.

DETAILED DESCRIPTION

Hereinafter, embodiments of the present invention will be described in detail based on drawings. It is to be noted that the same symbols are given to members having the same functions in all the drawings for illustrating the embodiments, and repeated description of the members is omitted. In addition, description of the same or similar portions is not repeated in principle except when needed in the embodiments. Further, there is a case of applying hatching even to a plan view, or a case of omitting hatching even in a cross-sectional view in order to make a configuration clearer in the drawings for illustrating the embodiments.

Embodiment 1

First, a manufacturing method of a CMOS (Complementary Metal Oxide Semiconductor) transistor according to an embodiment 1 will be described in order of step using FIGS. 1 to 6.

Figure 1:
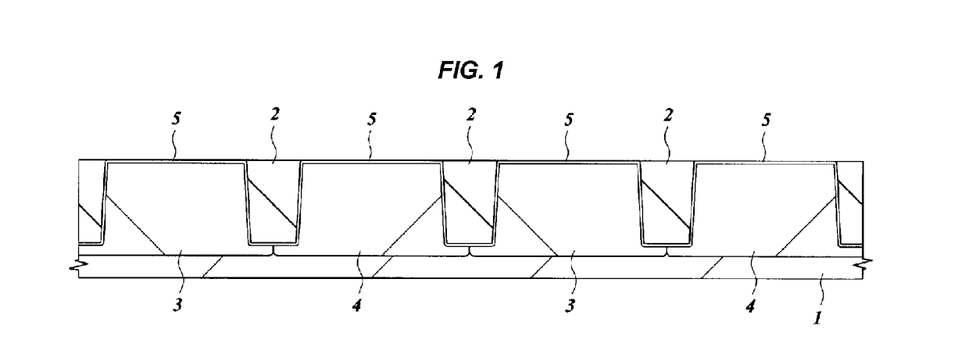
FIG. 1 is a cross-sectional view of a main part of a semiconductor wafer showing a manufacturing method of a CMOS device according to an embodiment 1 of the present invention.

As shown in FIG. 1, for example, after forming an element isolation trench 2, an n-type well 3, and a p-type well 4 in a principal surface of a wafer 1 comprised of single crystal silicon of 12 inches in diameter, a gate insulating film 5 comprised of silicon oxide is formed on respective surfaces of the n-type well 3 and the p-type well 4. Here, the element isolation trench 2 is formed by an STI (Shallow Trench Isolation) method that buries a silicon oxide film inside a trench formed in the principal surface of the wafer 1, and the n-type well 3 and the p-type well 4 are formed by ion-implanting impurities using a photoresist film as a mask. In addition, the gate insulating film 5 is formed by thermally oxidizing the respective surfaces of the n-type well 3 and the p-type well 4.

Figure 2:
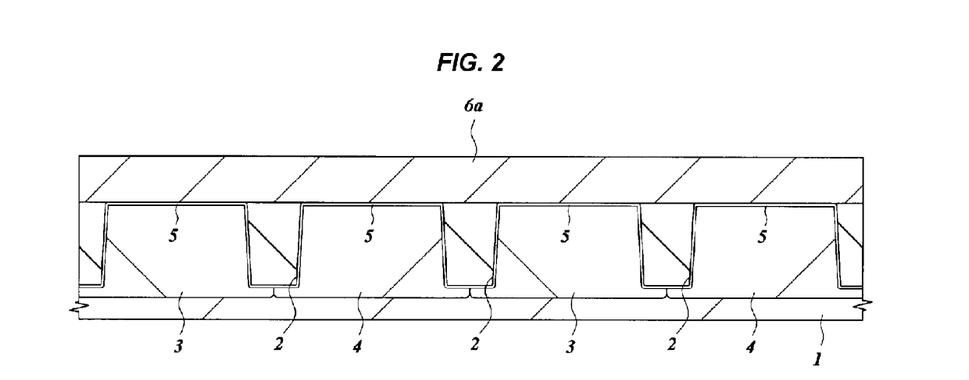
FIG. 2 is a cross-sectional view of the main part of the semiconductor wafer showing the manufacturing method of the CMOS device subsequent to FIG. 1.

Next, as shown in FIG. 2, a non-doped polycrystalline silicon film 6a is deposited over the principal surface of the wafer 1 using a CVD method. It is to be noted that an amorphous silicon film may be used instead of the polycrystalline silicon film 6a.

Figure 3:
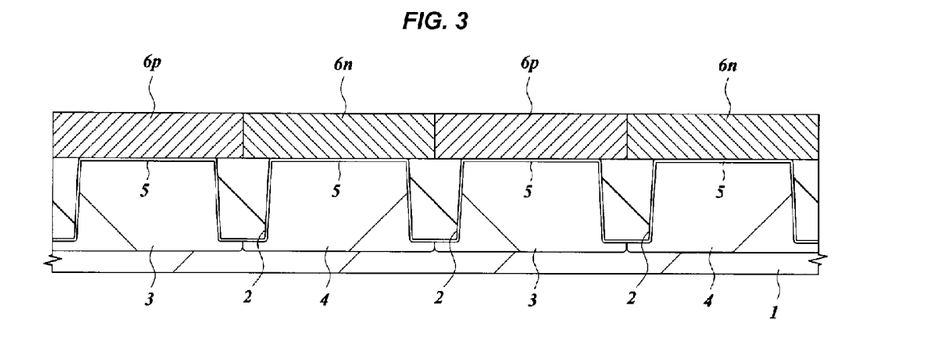
FIG. 3 is a cross-sectional view of the main part of the semiconductor wafer showing the manufacturing method of the CMOS device subsequent to FIG. 2.

Next, boron (B) is ion-implanted in the polycrystalline silicon film 6a in the upper portion of the n-type well 3 using a photoresist film (not shown) as a mask, phosphorus (P) is ion-implanted in the polycrystalline silicon film 6a in the upper portion of the p-type well 4, and subsequently, the wafer 1 is annealed to activate impurities (boron and phosphorus). As a result of this, as shown in FIG. 3, the polycrystalline silicon film 6a in the upper portion of the n-type well 3 becomes a p-type polycrystalline silicon film 6p, and the polycrystalline silicon film 6a in the upper portion of the p-type well 4 becomes an n-type polycrystalline silicon film 6n.

Figure 4:
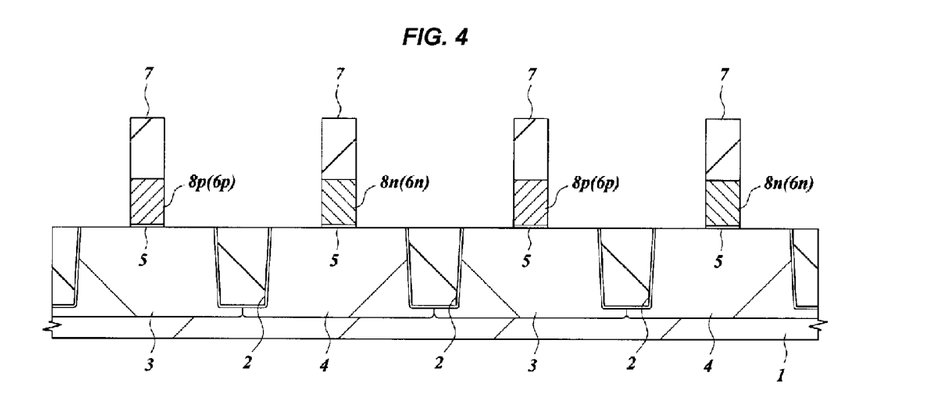
FIG. 4 is a cross-sectional view of the main part of the semiconductor wafer showing the manufacturing method of the CMOS device subsequent to FIG. 3.

Next, as shown in FIG. 4, the p-type polycrystalline silicon film 6p and the n-type polycrystalline silicon film 6n are dry-etched, respectively using a photoresist film 7 as a mask. As a result of this, a gate electrode 8p comprised of the p-type polycrystalline silicon film 6p is formed in the upper portion of the n-type well 3, and a gate electrode 8n comprised of the n-type polycrystalline silicon film 6n is formed in the upper portion of the p-type well 4.

Figure 5:
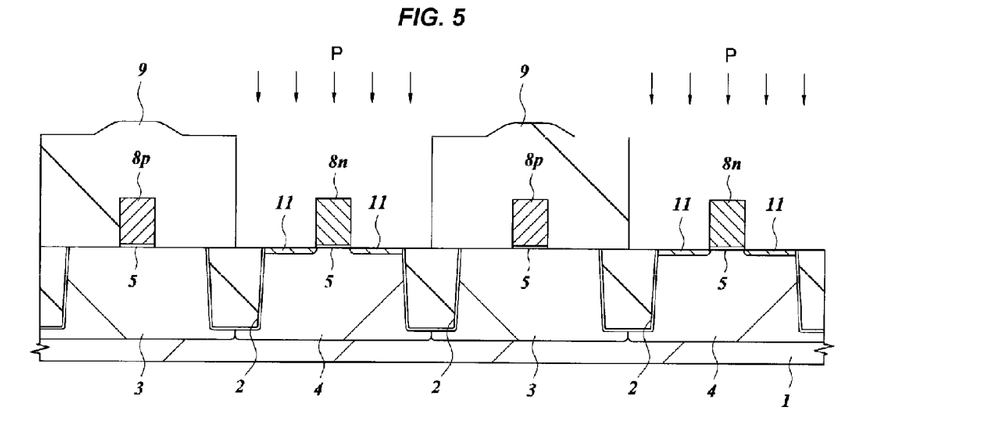
FIG. 5 is a cross-sectional view of the main part of the semiconductor wafer showing the manufacturing method of the CMOS device subsequent to FIG. 4.

Next, after removing the photoresist film 7 by ashing, as shown in FIG. 5, a photoresist film 9 is formed in the upper portion of the n-type well 3, phosphorus (P) is ion-implanted in the p-type well 4 using this photoresist film 9 as a mask, and thereby n-type semiconductor regions 11 are formed in the p-type well 4 of both sides of the gate electrode 8n.

Figure 6:
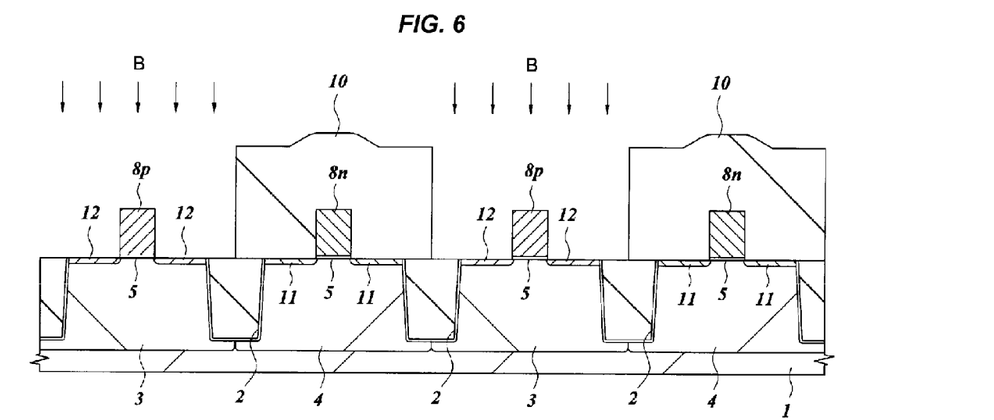
FIG. 6 is a cross-sectional view of the main part of the semiconductor wafer showing the manufacturing method of the CMOS device subsequent to FIG. 5.

Next, after removing the photoresist film 9 by ashing, as shown in FIG. 6, a photoresist film 10 is formed in the upper portion of the p-type well 4, boron (B) is ion-implanted in the n-type well 3 using this photoresist film 10 as a mask, and thereby p-type semiconductor regions 12 are formed in the n-type well 3 of both sides of the gate electrode 8p.

Next, after removing the photoresist film 10 by ashing, SPM cleaning of the wafer 1 is performed by the following method in order to remove contaminants (mainly, residual substances of ashing of the photoresist film) attached onto and remained on a surface of the wafer 1.

Figure 7:
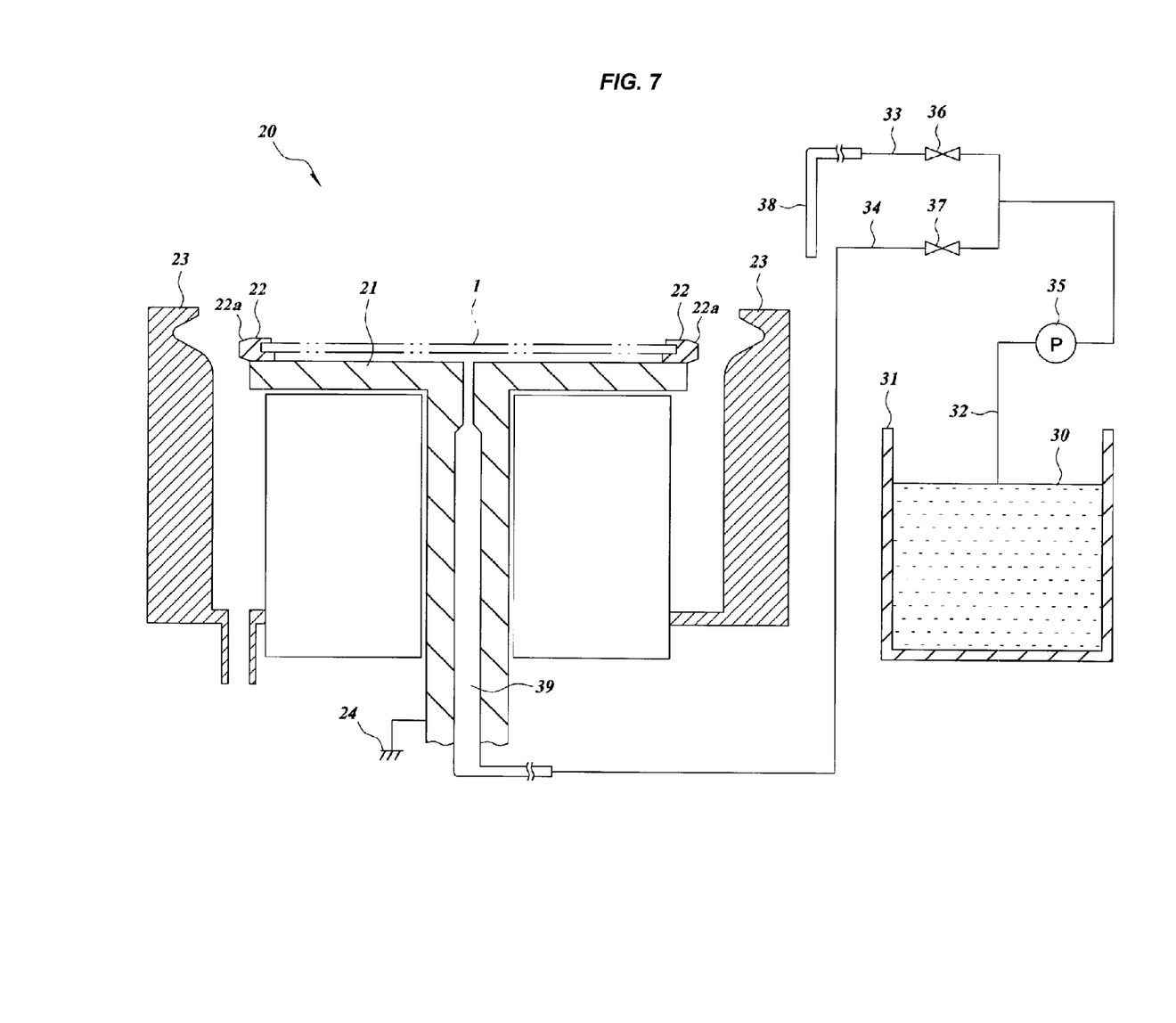
FIG. 7 is a schematic configuration view of a single wafer type cleaner used in the embodiment 1 of the present invention.
Figure 8:
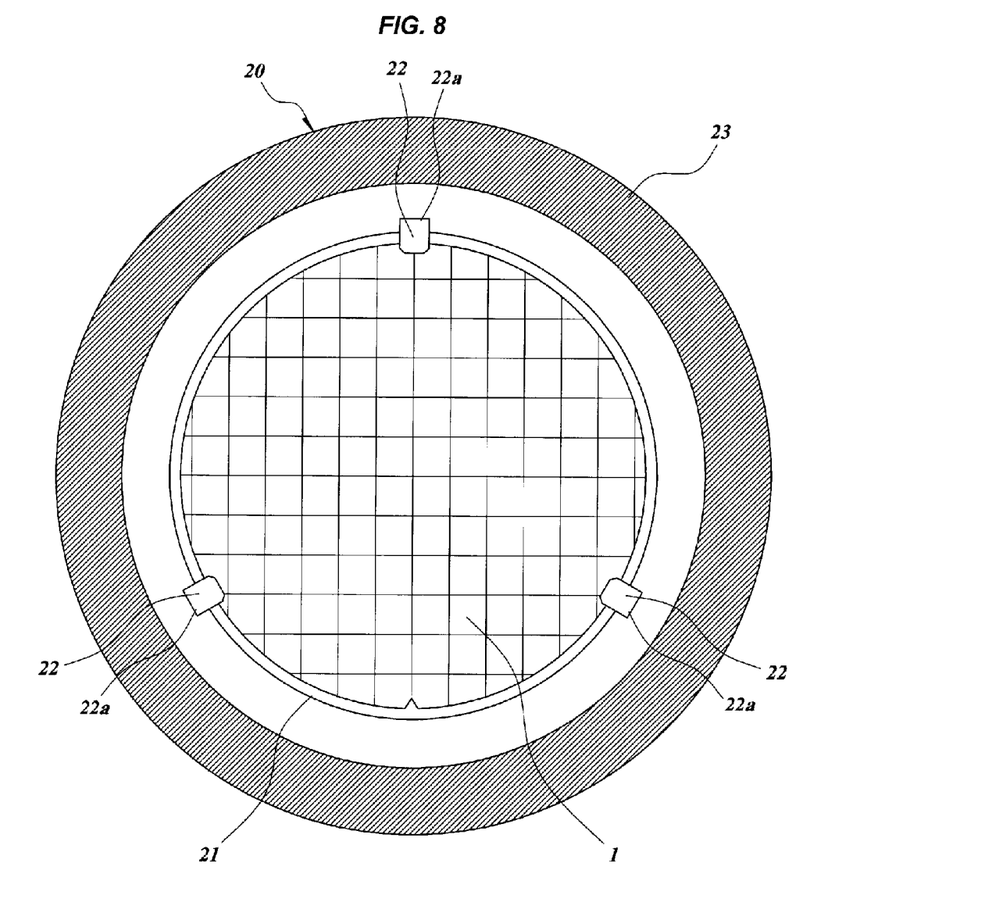
FIG. 8 is a schematic plan view when a cleaning section of the single wafer type cleaner shown in FIG. 7 is viewed from above.

FIG. 7 is a schematic configuration view of a single wafer type cleaner used in the embodiment 1, and FIG. 8 is a schematic plan view when a cleaning section of the single wafer type cleaner shown in FIG. 7 is viewed from above.

A single wafer type cleaner 20 is comprised of a cleaning section that cleans the wafer 1, and a chemical solution supply section that supplies a chemical solution (SPM) to this cleaning section. The cleaning section is comprised of a rotating stage 21 that rotates the wafer 1 in a horizontal plane, wafer chucks 22 that horizontally hold the wafer 1 placed in the upper portion of the rotating stage 21, a cleaning cup 23 that surrounds around the rotating stage 21, etc.

The above-described rotating stage 21, the wafer chucks 22, and the cleaning cup 23 are comprised of synthetic resin with corrosion resistance to the chemical solution (SPM), for example, vinyl chloride resin, ABS resin, etc. In addition, a plating film (not shown) comprised of metal, such as Pt (platinum) with corrosion resistance to the chemical solution (SPM), is formed on a surface of the synthetic resin that constitutes the rotating stage 21, and further, a ground wire 24 for discharge is connected to this plating film.

As shown in FIG. 8, three wafer chucks 22 that hold the wafer 1 are arranged along a periphery of the wafer 1 at regular intervals. In addition, each of the three wafer chucks 22 has a protrusion 22a extending outside the periphery of the wafer 1. It is to be noted that the number, a shape, an area, etc. of the wafer chuck 22 are not limited to examples shown in FIGS. 7 and 8, and a design thereof can be arbitrarily changed, but the wafer chuck 22 has a portion protruding outside the periphery of the wafer 1 (protrusion 22a) in any case.

The chemical solution supply section of the single wafer type cleaner 20 is comprised of a chemical solution tank 31 that stores a chemical solution 30, pipes 32, 33 and 34 for sending the chemical solution 30 in the chemical solution tank 31 to the cleaning section, a pump 35 connected in the middle of the pipe 32 for pumping the chemical solution, opening and closing valves 36 and 37 connected in the middle of the pipes 33 and 34, a movable cleaning nozzle 38 provided at one end of the pipe 33, etc. The chemical solution tank 31 and the pipes 32, 33 and 34 are comprised of synthetic resin with corrosion resistance to the chemical solution 30, for example, fluorine resin.

One end of the above-described pipe 34 is coupled to a pipe 39 provided in the rotating stage 21 of the cleaning section. An upper end of the pipe 39 in the rotating stage 21 is located at a top surface of the rotating stage 21, and the chemical solution 30 sent to the pipe 39 through the pipe 34 is discharged from the top surface of the rotating stage 21 to clean a back surface of the wafer 1.

Figure 9:
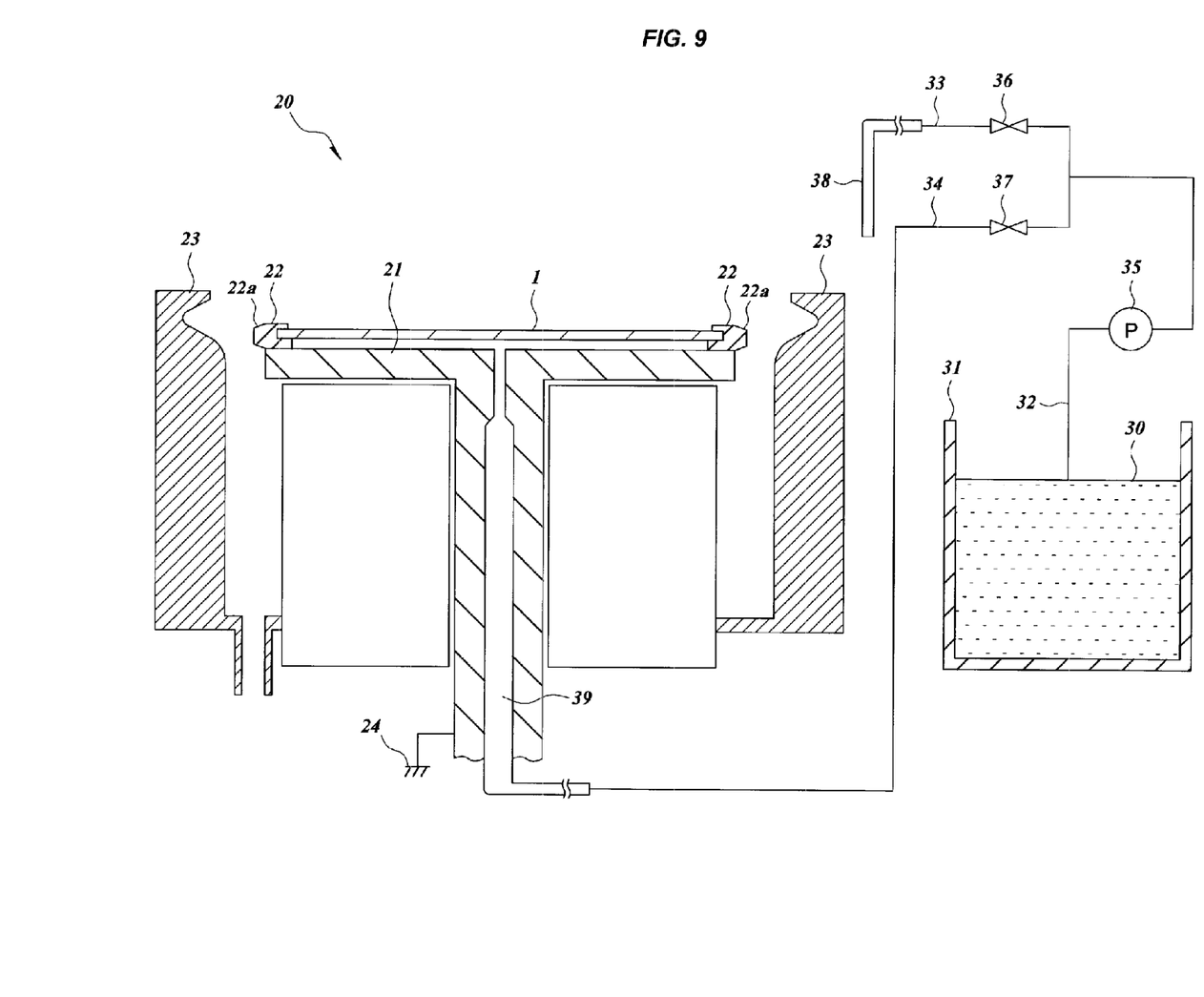
FIG. 9 is a schematic configuration view of the single wafer type cleaner showing a cleaning method according to the embodiment 1 of the present invention.

In order to clean the wafer 1 using the above-described single wafer type cleaner 20, first, as shown in FIG. 9, the wafer 1 is placed on the rotating stage 21 with the principal surface thereof directed upward, and the periphery of the wafer 1 is held and fixed by the wafer chucks 22. At this time, a slight gap is created between the back surface of the wafer 1 and the top surface of the rotating stage 21. Hence, the wafer 1 is in contact with only the wafer chucks 22, and it is in a non-contact state with other members of the single wafer type cleaner 20. In addition, the cleaning nozzle 38 is waiting outside the cleaning cup 23 at this time.

Figure 10:
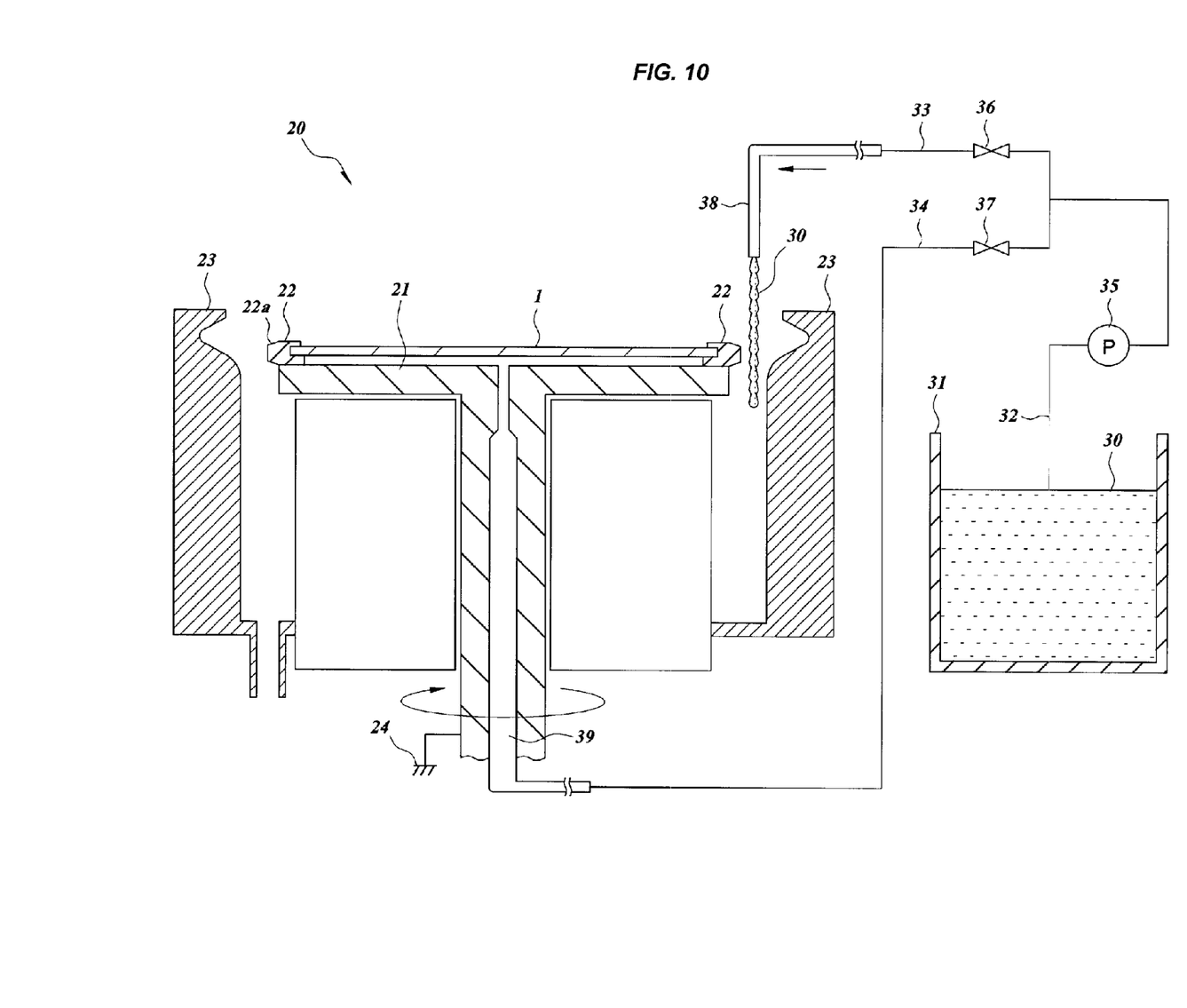
FIG. 10 is a schematic configuration view of the single wafer type cleaner showing the cleaning method subsequent to FIG. 9.

Next, as shown in FIG. 10, the rotating stage 21 is rotated at a predetermined speed, for example, at 500 rpm. As a result of this, the wafer chucks 22 and the wafer 1 held and fixed by the wafer chucks 22 also rotate at the same speed as the rotating stage 21.

In addition, while the cleaning nozzle 38 inside the cleaning cup 23 is made to move in tandem with a rotation of the rotating stage 21, the opening and closing valve 36 of the pipe 33 is opened, and when a tip of the cleaning nozzle 38 is located outside the wafer chucks 22, the chemical solution 30 is discharged from the tip of the cleaning nozzle 38. At this time, the chemical solution 30 discharged from the tip of the cleaning nozzle 38 has been charged with static electricity since it is subjected to friction with inner walls of the pipes 32 and 33 in the course of flowing therethrough.

Figure 11:
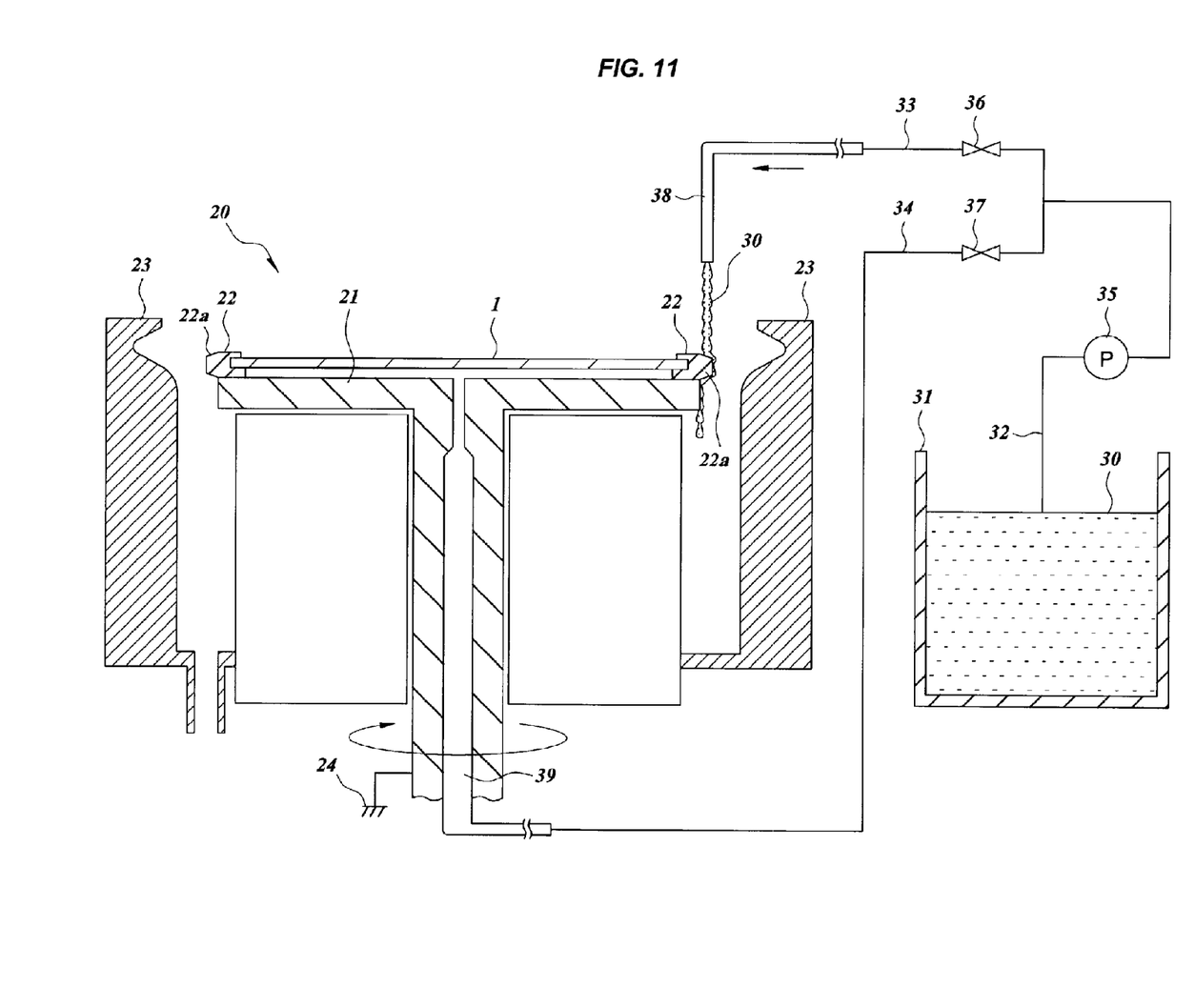
FIG. 11 is a schematic configuration view of the single wafer type cleaner showing the cleaning method subsequent to FIG. 10.

Next, as shown in FIG. 11, the cleaning nozzle 38 is made to move further inside the cleaning cup 23 while discharging the chemical solution 30 from the tip of the cleaning nozzle 38.

Subsequently, when the tip of the cleaning nozzle 38 is located above a rotational trajectory of the protrusions 22a of the wafer chucks 22, movement of the cleaning nozzle 38 is temporarily stopped.

As a result of this, since the chemical solution 30 discharged from the tip of the cleaning nozzle 38 gets contact with the protrusions 22a of the rotating wafer chucks 22, static electricity of the chemical solution 30 is discharged outside along surfaces of the wafer chucks 22 and a surface of the rotating stage 21. It is to be noted that a plating film comprised of Pt etc. may be applied to the surfaces of the wafer chucks 22 similarly to the surface of the rotating stage 21 in order to promote the discharge from the surfaces of the wafer chucks 22 to the surface of the rotating stage 21.

Figure 12:
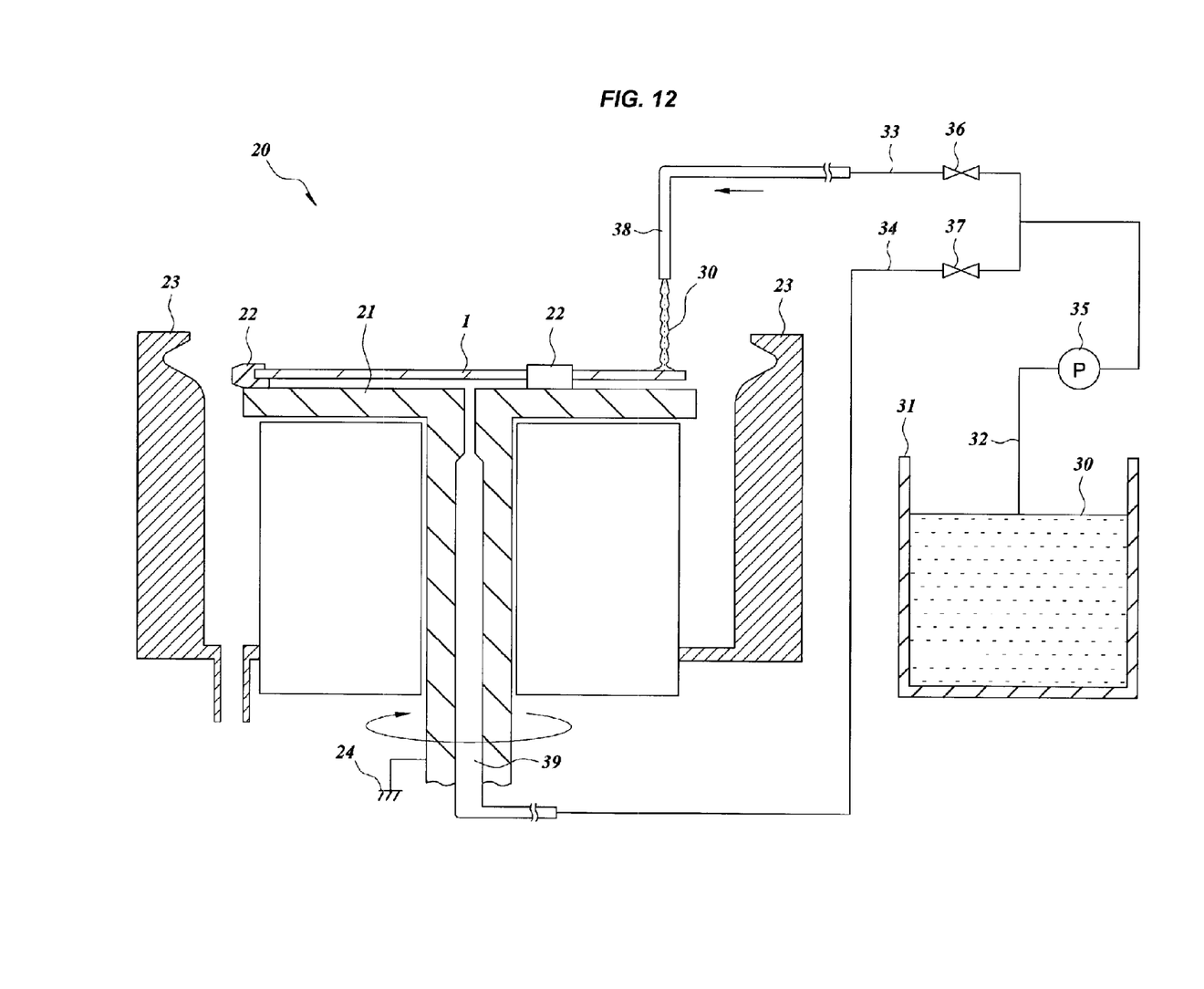
FIG. 12 is a schematic configuration view of the single wafer type cleaner showing a comparative example of a cleaning method.

As described above, the three wafer chucks 22 are arranged along the periphery of the wafer 1 at regular intervals (refer to FIG. 8). Hence, for example, as shown in FIG. 12, when moving the tip of the cleaning nozzle 38 above the wafer 1 without temporarily stopping the cleaning nozzle 38 above the rotational trajectory of the wafer chucks 22, there is a possibility that the charged chemical solution 30 is discharged onto the principal surface (top surface) of the wafer 1 without getting contact with the wafer chucks 22 depending on a rotational speed of the wafer chucks 22, and a moving speed of the cleaning nozzle 38.

In contrast with this, when the tip of the cleaning nozzle 38 is located above the rotational trajectory of the protrusions 22a of the wafer chucks 22, movement of the cleaning nozzle 38 is temporarily stopped, whereby the chemical solution 30 discharged from the tip of the cleaning nozzle 38 can be reliably made to contact with the protrusions 22a of the wafer chucks 22 regardless of the number of the wafer chuck 22 and the rotational speed thereof.

In addition, when making the chemical solution 30 contact with the wafer chucks 22, the chemical solution 30 discharged from the tip of the cleaning nozzle 38 is made to be continuously discharged so as not to intermit during the discharge. As a result of this, static electricity of the chemical solution 30 moving through the pipes 32 and 33 can also be discharged through the surfaces of the wafer chucks 22.

Figure 13:
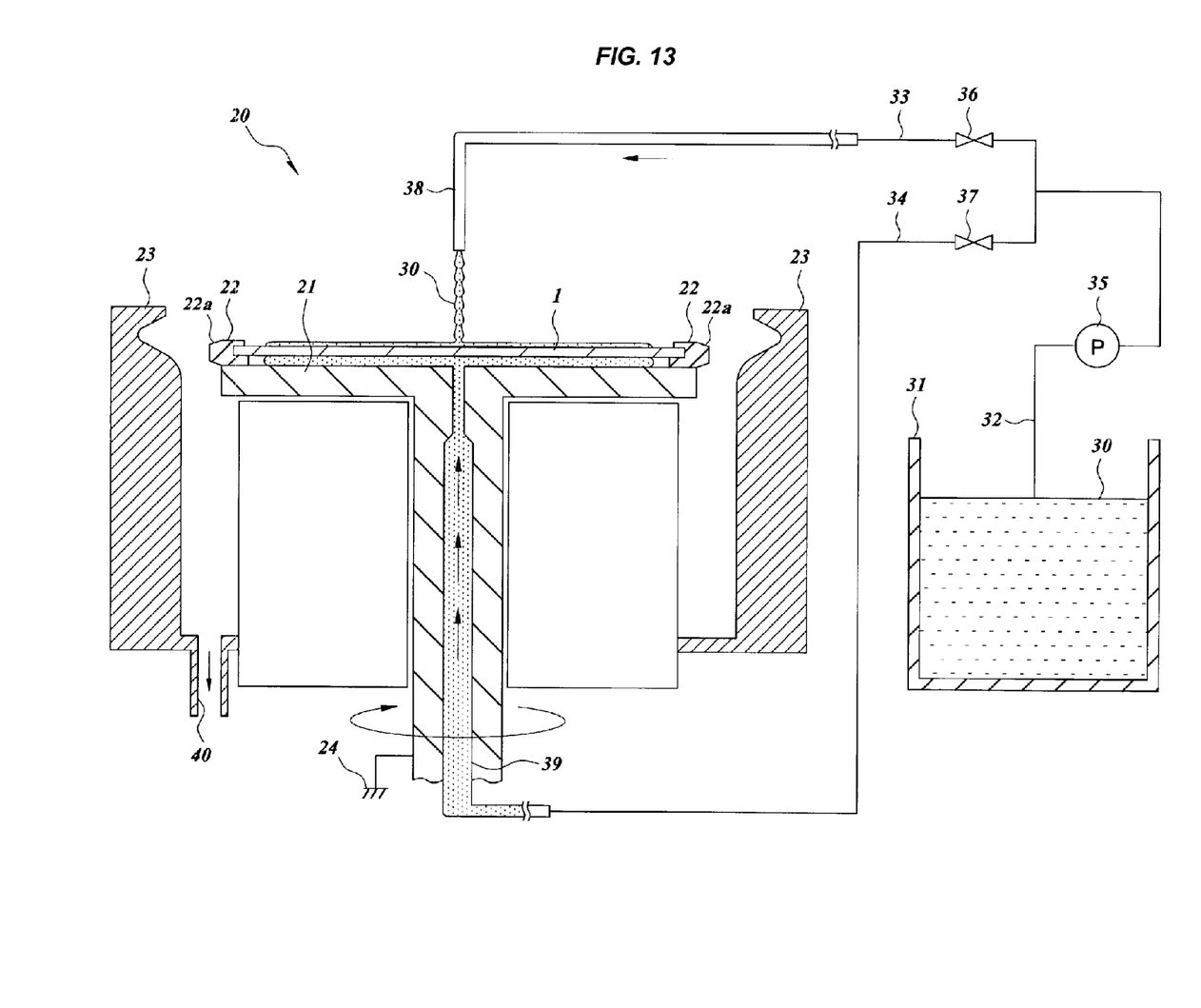
FIG. 13 is a schematic configuration view of the single wafer type cleaner showing the cleaning method subsequent to FIG. 11.

Next, as shown in FIG. 13, the cleaning nozzle 38 is made to move above a center of the wafer 1 while discharging the chemical solution 30 from the tip of the cleaning nozzle 38. In addition, the opening and closing valve 37 of the pipe 34 is opened, and the chemical solution 30 is supplied also onto the back surface (bottom surface) of the wafer 1 through the pipe 39 in the rotating stage 21 coupled to the pipe 34. Subsequently, the chemical solution 30 is continued to be supplied to the principal surface (top surface) and the back surface (bottom surface) of the wafer 1 in this state for a predetermined time, thereby cleaning both surfaces of the wafer 1. The chemical solution 30 supplied to the principal surface (top surface) and the back surface (bottom surface) of the wafer 1 is then discharged outside through a liquid discharge port 40 of a bottom of the cleaning cup 23.

It is to be noted that the chemical solution 30 flowing through the pipe 34 is also subjected to friction with an inner wall of the pipe 34 to be charged with static electricity similarly to the chemical solution 30 flowing through the pipe 33. However, as described above, the Pt plating film is formed on the surface of the synthetic resin constituting the rotating stage 21, and further, the ground wire 24 for discharge is connected to this Pt plating film. Hence, when the chemical solution 30 flowing through the pipe 34 flows into the pipe 39 in the rotating stage 21, static electricity of the chemical solution 30 is discharged outside through the Pt plating film and the ground wire 24, and therefore, the chemical solution 30 that gets contact with the back surface of the wafer 1 is not charged with static electricity.

Figure 14:
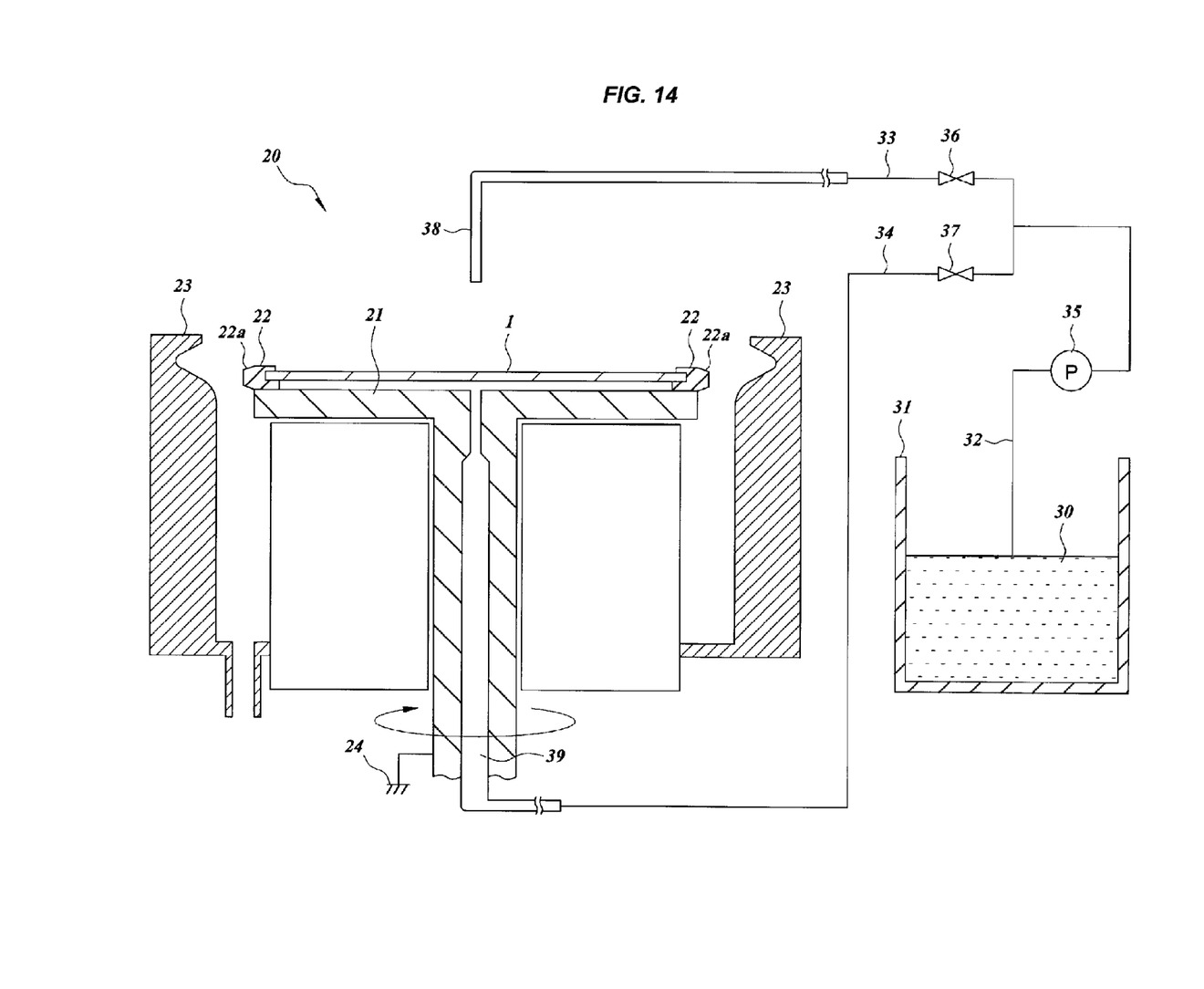
FIG. 14 is a schematic configuration view of the single wafer type cleaner showing the cleaning method subsequent to FIG. 13.

Next, as shown in FIG. 14, supply of the chemical solution 30 to the principal surface and the back surface of the wafer 1 is stopped by closing the opening and closing valves 36 and 37. Subsequently, the rotating stage 21 is rotated at a high speed of 1500 rpm, and the chemical solution 30 attached to the principal surface and the back surface of the wafer 1 is centrifugally shaken off outside the wafer 1, thereby completing the SPM cleaning of the wafer 1. After that, the wafer 1 is conveyed to a single wafer type pure water cleaner, which is not shown, and SPM residual substances that have remained on the principal surface and the back surface of the wafer 1 are cleaned off.

As described above, in the embodiment 1, when the chemical solution 30 is supplied to the principal surface of the wafer 1 from the tip of the cleaning nozzle 38, the chemical solution 30 is previously made to contact with the protrusions 22a of the wafer, chucks 22 that have held and fixed the wafer 1, thereby discharging the static electricity of the chemical solution 30. As a result of this, since the discharged chemical solution 30 is supplied onto the principal surface of the wafer 1, abnormal discharge (damage) of the wafer 1 due to charging of the chemical solution 30 can be reliably suppressed.

Embodiment 2

In the above-described embodiment 1, in order to reliably make the chemical solution 30 contact with the protrusions 22a of the rotating wafer chucks 22, when the tip of the cleaning nozzle 38 is located above the rotational trajectory of the protrusions 22a, movement of the cleaning nozzle 38 is temporarily stopped. However, it is not necessary to completely stop the cleaning nozzle 38 above the rotational trajectory of the protrusions 22a, and the cleaning nozzle 38 may be moved at a speed lower enough with respect to the rotational speed of the wafer chucks 22.

Figure 15:
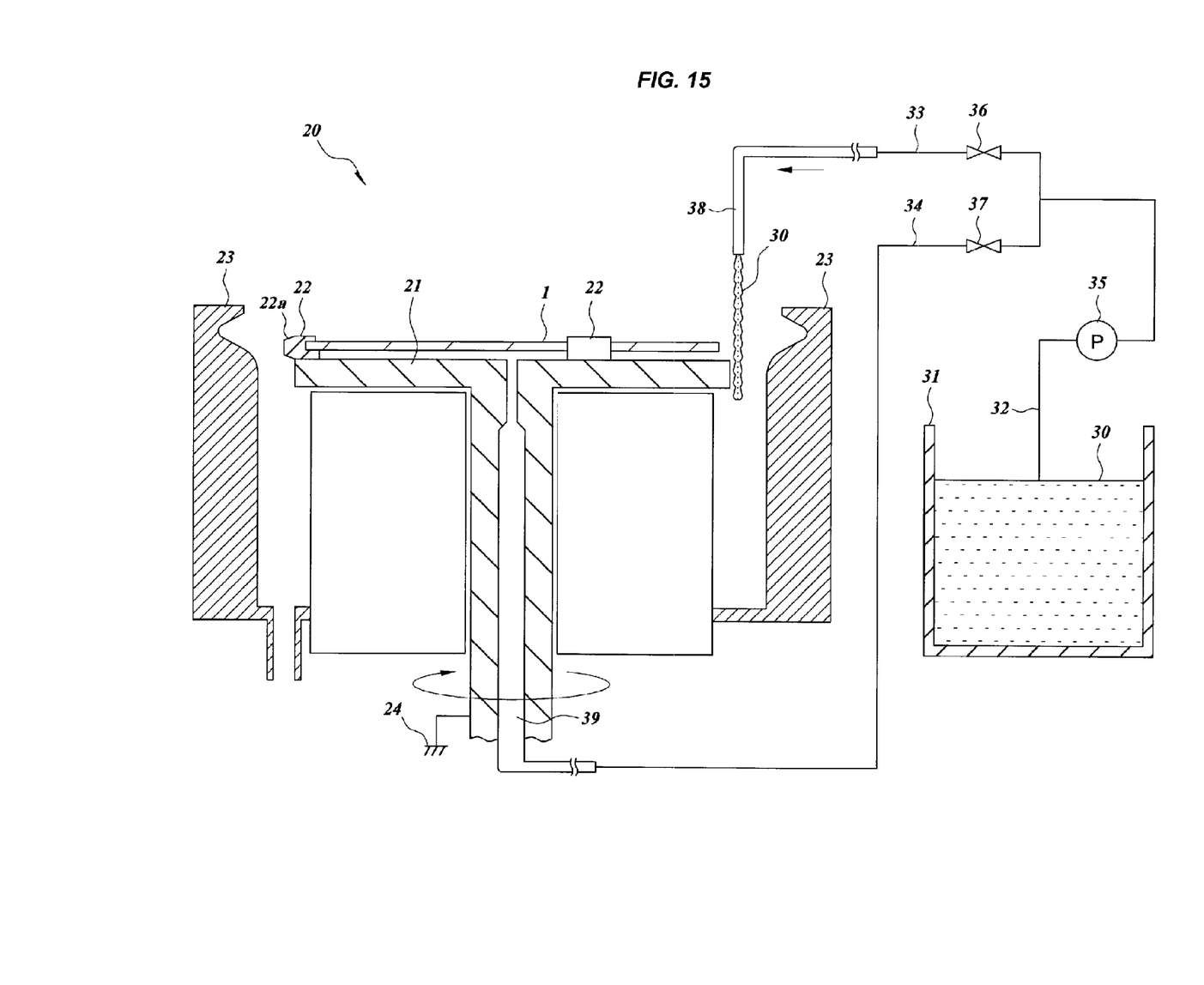
FIG. 15 is a schematic configuration view of the single wafer type cleaner showing a cleaning method according to an embodiment 2 of the present invention.
Figure 16:
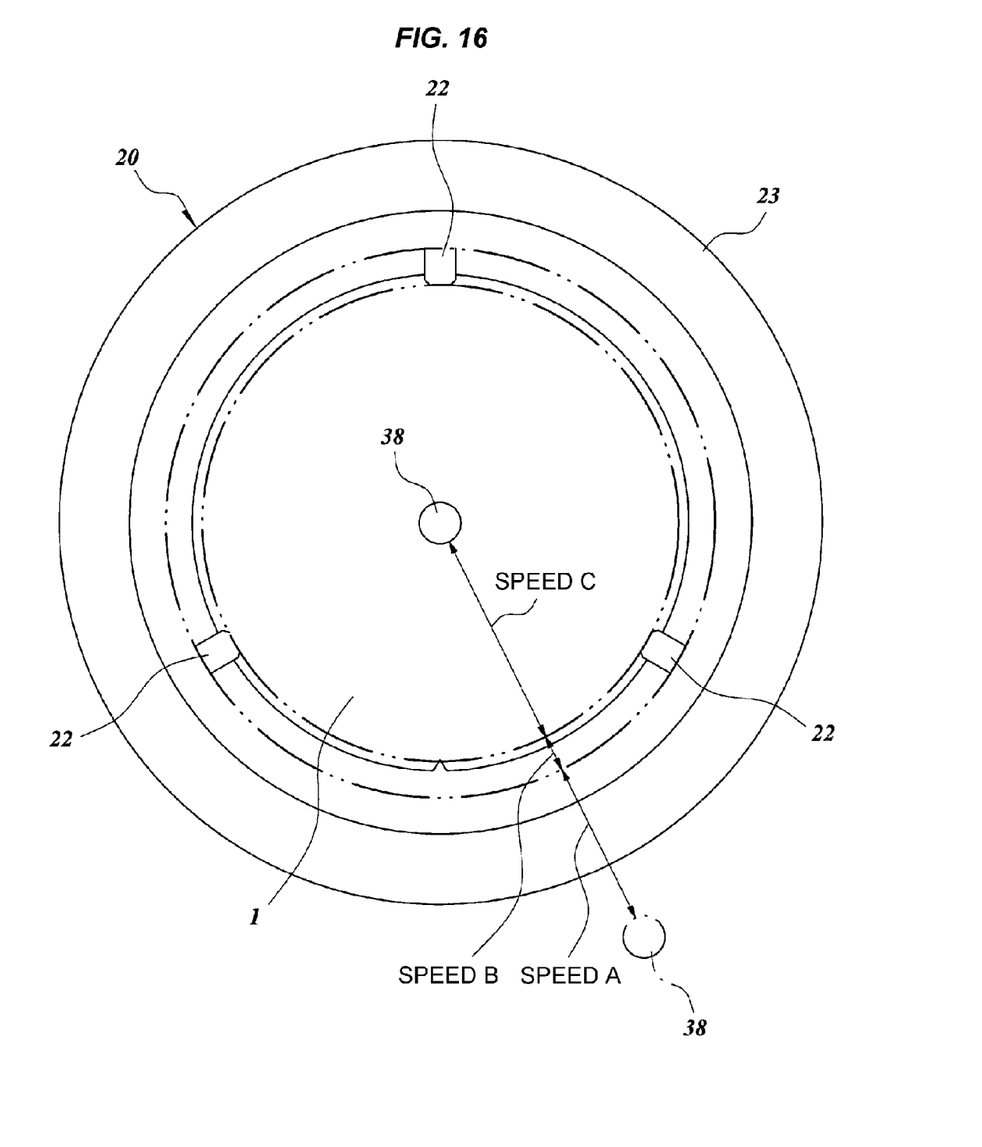
FIG. 16 is a schematic plan view of the single wafer type cleaner showing change of a moving speed of a cleaning nozzle.

Namely, after steps of the embodiment 1 shown in FIGS. 9 and 10, as shown in FIGS. 15 and 16, the cleaning nozzle 38 having waited outside the cleaning cup 23 is made to move inside the cleaning cup 23 at a predetermined speed A, and the tip of the cleaning nozzle 38 is made to be located above the rotational trajectory of the protrusions 22a of the wafer chucks 22. The above-described movement of the cleaning nozzle 38 is performed while discharging the chemical solution 30 from the tip of the cleaning nozzle 38.

Subsequently, while the tip of the cleaning nozzle 38 is located above the rotational trajectory of the protrusions 22a, the cleaning nozzle 38 is made to move at a speed B lower than the above-described speed A (B<A). As a result of this, as shown in FIG. 11, since the chemical solution 30 can be reliably made to contact with the protrusions 22a of the wafer chucks 22 rotating at a high speed, static electricity of the chemical solution 30 can be discharged prior to the step of supplying the chemical solution 30 onto the principal surface of the wafer 1.

After that, as shown in FIG. 13, the cleaning nozzle 38 is made to move above the center of the wafer 1 while discharging the chemical solution 30 from the tip of the cleaning nozzle 38. At this time, it is defined that a speed C at which the cleaning nozzle 38 is made to move is equal to or not less than the moving speed B of the cleaning nozzle 38 when the tip of the cleaning nozzle 38 is located above the rotational trajectory of the protrusions 22a (CB). In addition, at this time, the chemical solution 30 is supplied also onto the back surface (bottom surface) of the wafer 1 through the pipe 39 in the rotating stage 21, and the chemical solution 30 is continued to be supplied to the principal surface and the back surface of the wafer 1 for a predetermined time, thereby cleaning the both surfaces of the wafer 1.

As a result of this, since the discharged chemical solution 30 is supplied onto the principal surface of the wafer 1 similarly to the above-described embodiment 1, abnormal discharge (damage) of the wafer 1 due to charging of the chemical solution 30 can be reliably suppressed.

As described above, although the invention made by the inventor has been specifically described based on the embodiments, the present invention is not limited to the above-described embodiments, and it goes without saying that the present invention can be variously changed without departing from the scope thereof.

In the above-described embodiments, although the present invention has been applied to the SPM cleaning step after forming a diffusion layer (n-type semiconductor region 11 and p-type semiconductor region 12) of the CMOS transistor by ion implantation using the photoresist film as the mask, it is not limited to this, and it can be widely applied to SPM cleaning after chemical mechanical polishing, SPM cleaning after resist removal, etc.

In addition, although a case has been described in the above-described embodiments where the present invention is applied to the SPM cleaning step, the present invention is not limited to this, and it can be widely applied to a single wafer cleaning step in which another chemical solution, particularly, a chemical solution containing electrolytes, such as acid and alkali, is used.

In addition, although a case has been described in the above-described embodiments where the present invention is applied to the cleaning step of the semiconductor wafer, the present invention is not limited to this and, for example, it can also be applied to a cleaning step of a glass substrate for liquid crystals, etc.

The present invention can be applied to single wafer type cleaning of a semiconductor wafer etc. using a chemical solution.

What is claimed is:

1. A manufacturing method of a semiconductor device, the method comprising:
   cleaning a semiconductor wafer in a single wafer system by supplying a chemical solution onto a top surface of the semiconductor wafer from a cleaning nozzle while holding a periphery of the semiconductor wafer with wafer chucks and rotating the semiconductor wafer and the wafer chucks in a horizontal plane;
   bringing the chemical solution into contact with the wafer chucks prior to the step of supplying the chemical solution onto the top surface of the semiconductor wafer by:
   (a) locating a tip of the cleaning nozzle above a rotational trajectory of the wafer chucks by moving the cleaning nozzle at a predetermined speed (A);
   (b) moving the cleaning nozzle at a speed (B) lower than the speed (A) while the tip of the cleaning nozzle is located above the rotational trajectory of the wafer chucks; and
   (c) after the step (b), moving the cleaning nozzle above the semiconductor wafer at a speed (C) higher than the speed (B); and
   wherein the step of bringing the chemical solution into contact with the wafer chucks and the step of supplying the chemical solution onto the top surface of the semiconductor wafer are performed while continuously discharging the chemical solution from the cleaning nozzle.

2. The manufacturing method of a semiconductor device according to claim 1,
   wherein the wafer chucks have protrusions extending outside the periphery of the semiconductor wafer, and the chemical solution is brought into contact with the protrusions in the step of bringing the chemical solution into contact with the wafer chucks.

3. The manufacturing method of a semiconductor device according to claim 1,
   wherein a conductive coating film is formed on surfaces of the wafer chucks.

4. The manufacturing method of a semiconductor device according to claim 1,
   wherein the chemical solution is comprised of an electrolyte solution containing acid or alkali.

5. The manufacturing method of a semiconductor device according to claim 4,
   wherein the acid is sulfuric acid.

6. The manufacturing method of a semiconductor device according to claim 1, further comprising:
   creating a gap between a back surface of the wafer and a top surface of a rotating stage.

7. The manufacturing method of a semiconductor device according to claim 1,
   wherein the cleaning nozzle is temporarily stopped above a rotational trajectory of the wafer chucks in the step of bringing the chemical solution into contact with the wafer chucks.

8. The manufacturing method of a semiconductor device according to claim 1, further comprising:
   discharging static electricity caused by a flow of said chemical solution within a pipe which supplies said chemical solution to a back surface of said semiconductor wafer.

9. The manufacturing method of a semiconductor device according to claim 8, wherein said discharging static electricity uses a platinum metal plating film.

* * * * *